(12) United States Patent
Tsai et al.

(10) Patent No.: US 8,629,435 B2
(45) Date of Patent: Jan. 14, 2014

(54) METHODS OF EXTRACTING FIN HEIGHTS AND OVERLAP CAPACITANCE AND STRUCTURES FOR PERFORMING THE SAME

(75) Inventors: Ming-Horn Tsai, Taipei (TW); Hsiao-Han Liu, Gongguan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 144 days.

(21) Appl. No.: 13/411,307

(22) Filed: Mar. 2, 2012

(65) Prior Publication Data
US 2013/0228778 A1     Sep. 5, 2013

(51) Int. Cl.
*H01L 23/58* (2006.01)
(52) U.S. Cl.
USPC .................. 257/48; 438/17; 257/E21.524
(58) Field of Classification Search
CPC ....................................................... H01L 23/58
USPC .................................................. 257/E21.524
See application file for complete search history.

(56) References Cited

U.S. PATENT DOCUMENTS 7,227,183 B2 * 6/2007 Donze et al. .................... 257/48
2009/0184316 A1 * 7/2009 Hsu et al. ........................ 257/48

* cited by examiner

*Primary Examiner* — Stephen W Smoot
*Assistant Examiner* — Pavel Ivanov
(74) *Attorney, Agent, or Firm* — Slater & Matsil, L.L.P.

(57) ABSTRACT

A first test structure includes a first isolation region, a first gate electrode over the first isolation region, a first and a second semiconductor fin, and a first contact plug over the first and the second semiconductor fins. A second test structure includes a second isolation region, a second gate electrode over the second isolation region, a third semiconductor fin and a dielectric fin, and a second contact plug over the third semiconductor fin. The first, the second, and the third semiconductor fins and the dielectric fin have substantially a same fin height. A method includes measuring a first capacitance between the first gate electrode and the first contact plug, measuring a second capacitance between the second gate electrode and the second contact plug, and calculating the same fin height from a capacitance difference between the second capacitance and the first capacitance.

20 Claims, 12 Drawing Sheets

METHODS OF EXTRACTING FIN HEIGHTS AND OVERLAP CAPACITANCE AND STRUCTURES FOR PERFORMING THE SAME

BACKGROUND

In the manufacturing of Fin Field-Effect Transistors (Fin-FETs), fin heights often need to be extracted. In addition, the overlap capacitance values between gate electrodes of Fin-FETs and the underlying features such as Lightly Doped Drain/source (LDD) regions also need to be determined sometimes. Previously, the extraction of the fin heights includes forming samples that include fins having different fin heights, measuring the fin heights using Transmission Electron Microscope (TEM), and measuring the respective inversion capacitance of the fins. A mapping is thus formed to correlate the inversion capacitance values with the fins heights. When a fin height of a fin on a wafer needs to be determined, the determination of the fin height may be performed by measuring the inversion capacitance of the fin, and find out the respective fin height from the mapping. This method, however, suffers from the adverse effect of the parasitic capacitance from contact plugs and epitaxy regions, which parasitic capacitance is included in the measured inversion capacitance. Similarly, the overlap capacitance also suffers from the adverse effect of the respective parasitic capacitance.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Methods for determining fin heights and overlap capacitances and the test structures for performing the same are provided in accordance with various exemplary embodiments. The variations and the operation of the embodiments are discussed. Throughout the various views and illustrative embodiments, like reference numbers are used to designate like elements.

Figure 1A:
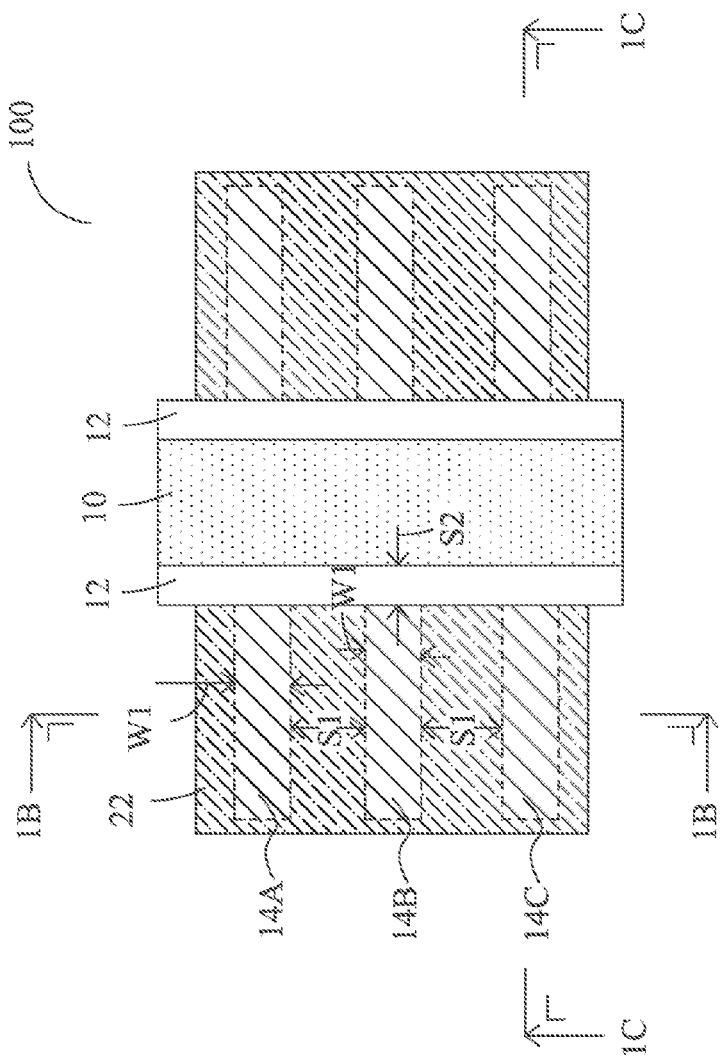
FIGS. 1A through 2C are top views and cross-sectional views of test structures for determining fin heights in accordance with some exemplary embodiments.
Figure 1B:
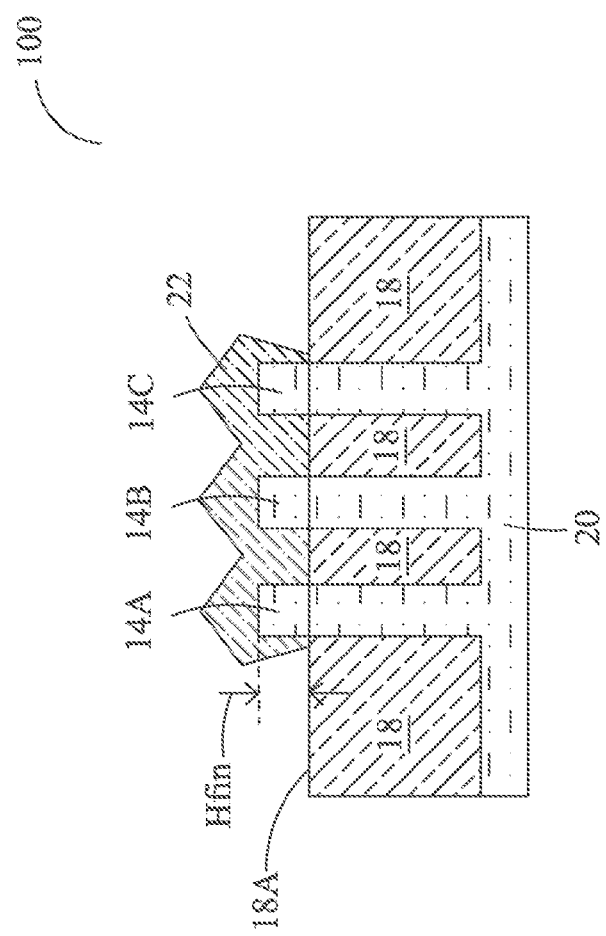
Figure 1C:
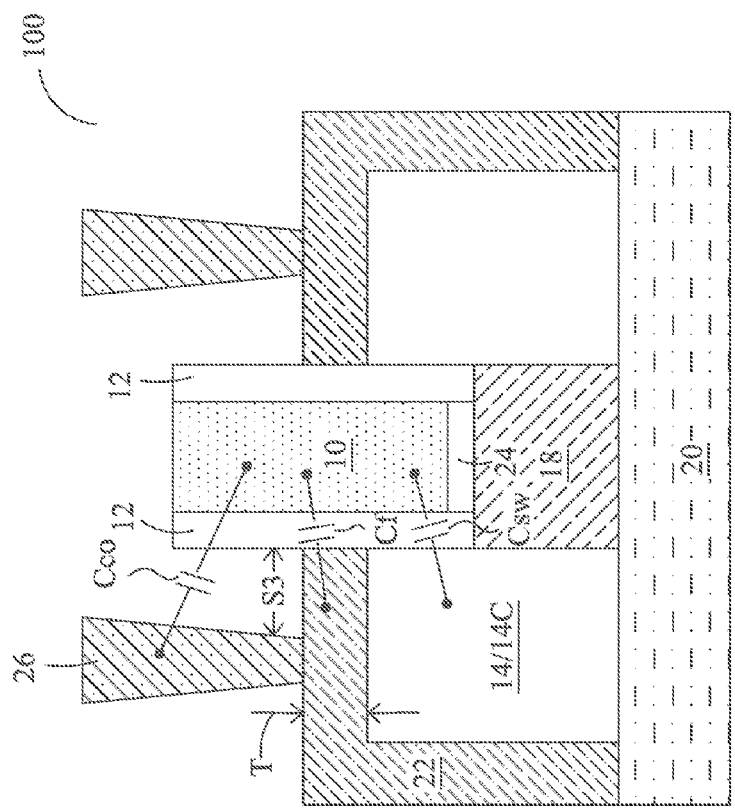
Figure 2A:
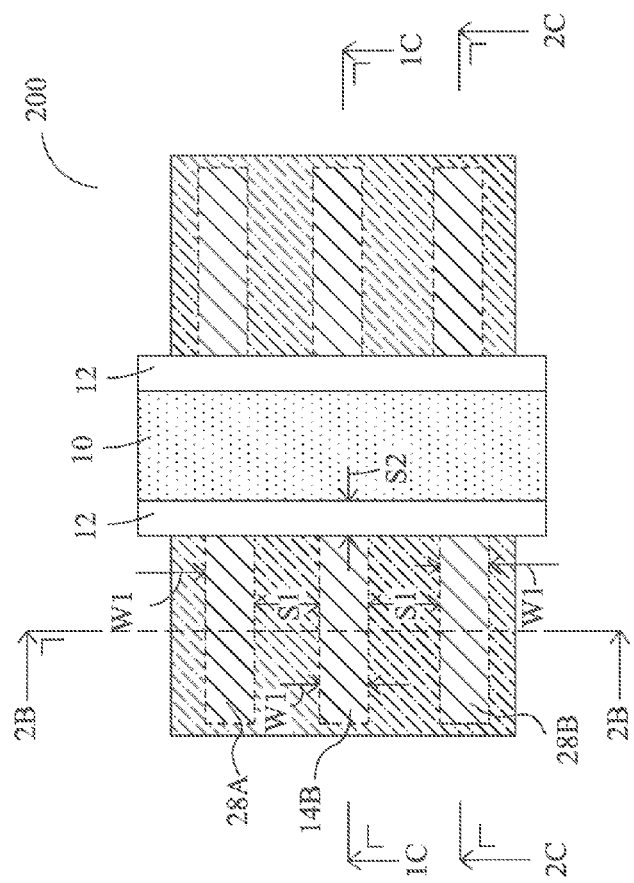
Figure 2B:
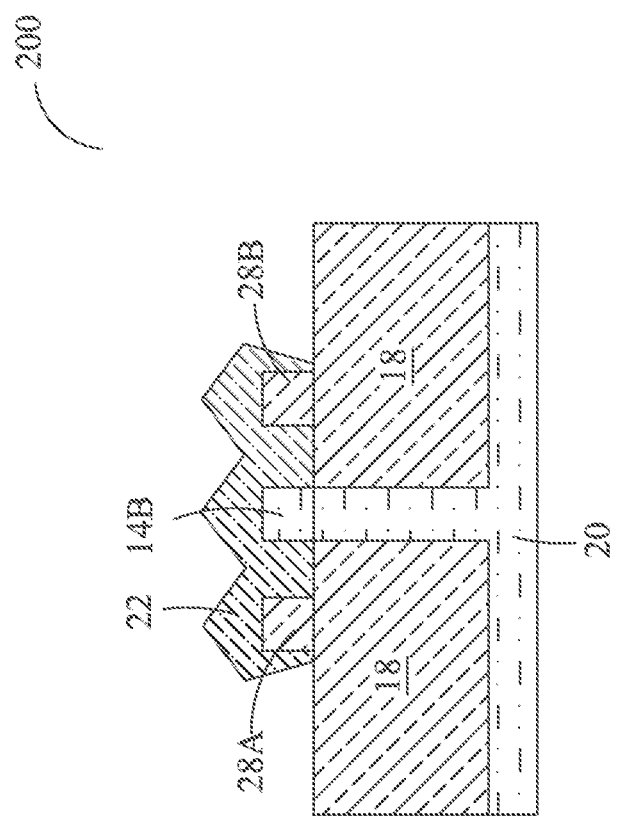
Figure 2C:
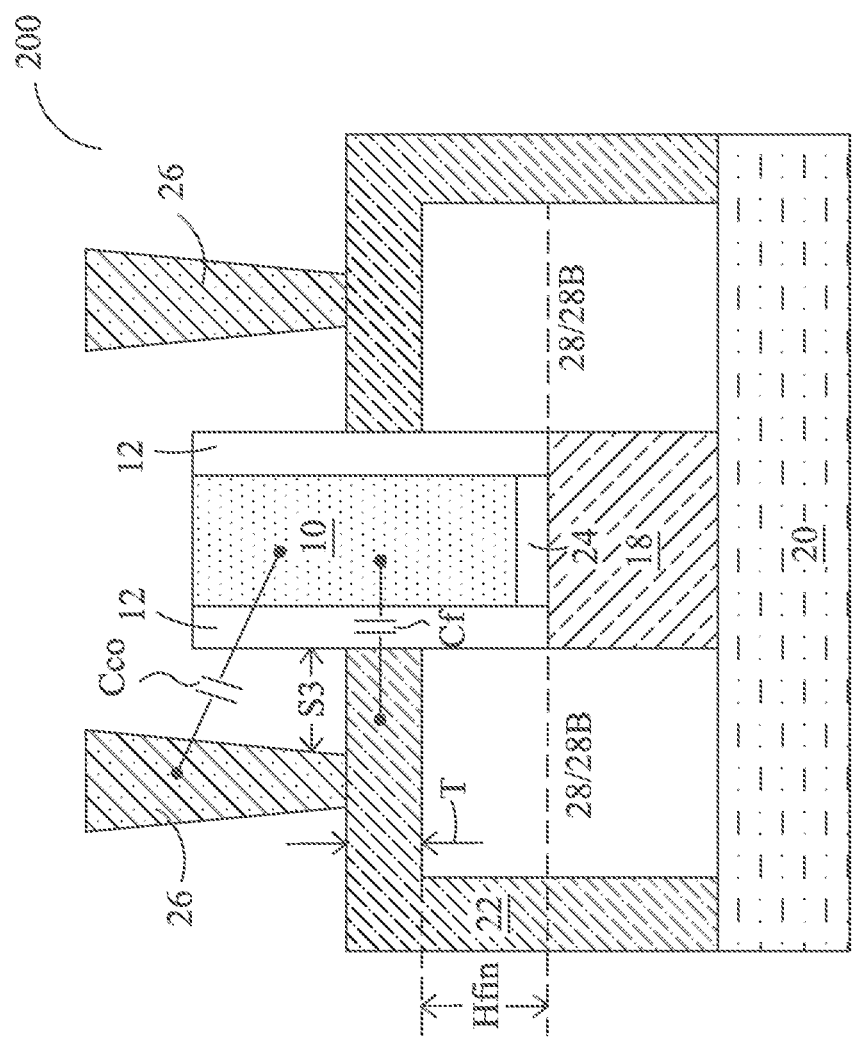

FIGS. 1A through 2C are top views and cross-sectional views of a test structure set for determining fin heights in accordance with some exemplary embodiments. The test structure set includes first test structure 100 (FIGS. 1A through 1C) and second test structure 200 (FIGS. 2A through 2C). Test structures 100 and 200 may have substantially the same layouts and sizes, except that some semiconductor fins in first test structure 100 are replaced by some isolation fins such as Shallow Trench Isolation (STI) fins to form second test structure 200. Test structures 100 and 200 may be formed on a same substrate, a same wafer, and/or a same die.

FIG. 1A illustrates a top view of test structure 100, which includes gate electrode 10 and gate spacers 12 on the edges of gate electrode 10. Semiconductor fins 14 (including 14A, 14B, and 14C) are formed on a side of gate electrode 10. The lengthwise direction of semiconductor fins 14 may be perpendicular to the lengthwise direction of gate electrode 10. In some embodiments, semiconductor fins 14A, 14B, and 14C have equal spacing S1 therebetween, although the spacing may also be different from each other. The spacings from semiconductor fins 14A, 14B, and 14C to gate electrode 10 may be equal to each other, and are marked as S2. The widths of semiconductor fins 14A, 14B, and 14C are W1, which may be equal to each other.

FIG. 1B illustrates a cross-sectional view of the structure shown in FIG. 1A, wherein the cross-sectional view is obtained from the plane crossing line 1B-1B in FIG. 1A. In test structure 100, STI regions 18 are formed on substrate 20, which may be a semiconductor substrate such as a silicon substrate. Semiconductor fins 14A, 14B, and 14C are above the top surfaces 18A of STI regions 18. Semiconductor fins 14A, 14B, and 14C have fin height Hfin. Epitaxy region 22 is formed on the top surface and sidewalls of semiconductor fins 14. Epitaxy region 22 may be formed using one of the Chemical Vapor Deposition (CVD) methods, for example, and is formed by epitaxy. Epitaxy region 22 may include silicon, silicon germanium, silicon carbon, or the like, for example. The portions of epitaxy region 22 grown from semiconductor fins 14A, 14B, and 14C may merge with each other to form a continuous epitaxy region, or remain separate from each other.

FIG. 1C illustrates a cross-sectional view of the structure shown in FIG. 1A, wherein the cross-sectional view is obtained from the plane crossing line 1C-1C in FIG. 1A. As shown in the cross-sectional view, STI region 18 is underlying gate electrode 10, gate spacers 12, and gate dielectric 24. Epitaxy region 22 is formed on fins 14. Contact plug 26 is formed over, and electrically coupled to, fins 14 and epitaxy region 22. A silicide region (not shown) may be formed over epitaxy region 22 and underlying contact plug 26. Although one contact plug 26 is illustrated as being over semiconductor fins 14A, 14B, and 14C, there may be one or a plurality of contact plugs 26. Throughout the description, the parasitic capacitance between all contact plugs 26 (that are over and connected to semiconductor fins 14) and gate electrode 10 is referred to as Cco. The parasitic capacitance between all epitaxy region 22 (that is grown from semiconductor fins 14) and the overlying silicide regions and gate electrode 10 is referred to as Cf. The parasitic capacitance between each of fins 14A, 14B, and 14C and gate electrode 10 is referred to as Csw. Accordingly, the total capacitance Ca measured between contact plug(s) 26 and gate electrode 10 is:

$$Ca = Cco + Cf + 3*Csw \qquad [\text{Eq. 1}]$$

Wherein the value "3" is resulted from three semiconductor fins 14A, 14B, and 14C, whose capacitances are added together.

FIGS. 2A through 2C are top views and cross-sectional views of test structure 200 in accordance with some exemplary embodiments. Test structure 200 is substantially identical to test structure 100, except that one or a plurality, but not all, of semiconductor fins 14 is replaced with STI fin(s) 28 (including 28A and 28B), which are of the same size as the respective semiconductor fins 14. In some exemplary embodiments, semiconductor fins 14A and 14C are replaced by STI fins 28A and 28B. Accordingly, STI fins 28 may have identical sizes such as heights Hfin, widths W1, lengths, or the like, as semiconductor fins 14. Furthermore, the spacings (such as S1 and S2) between STI fins 28 and other components in test structure 200 may also be the same as the respective spacing between semiconductor fins 14 and other components in test structure 100. The remaining like components in test structure 200 are marked using same reference numerals as in test structure 100 to indicate that they may be identical to each other, which means they may be formed using the same materials, having same sizes (such as widths W1), and have same relationships (such as same spacings S1, S2, and S3) as in test structure 100. These remaining components include, but are not limited to, gate electrode 10, gate spacer 12, fin 14B, STI regions 18, gate dielectric 24, and the like. Furthermore, the like components in test structures 100 and 200 may be formed simultaneously, and on the same substrate 20, in the same die, and/or in the same wafer.

FIG. 2B illustrates a cross-sectional view of the structure shown in FIG. 2A, wherein the cross-sectional view is obtained from the plane crossing line 2B-2B in FIG. 2A. FIG. 2C illustrates a cross-sectional view of the structure shown in FIG. 2A, wherein the cross-sectional view is obtained from the plane crossing line 2C-2C in FIG. 2A. FIGS. 2B and 2C illustrate that in test structure 200, epitaxy region 22 is grown over semiconductor fin 14B and STI fins 28A and 28B. Epitaxy region 22 in test structure 200 may have substantially the same size as epitaxy region 22 in test structure 100. Since fin 14B remains to be a semiconductor fin, the cross-sectional view obtained from the plane crossing line 1C-1C in FIG. 2A may also be the same as in FIG. 1C.

Contact plug(s) 26 (FIG. 2C) may have the same structure, and the same size as in test structure 100 in FIGS. 1A through 1C. Accordingly, the parasitic capacitance Cco between contact plug(s) 26 and gate electrode 10 in test structure 200 is the same as the parasitic capacitance Cco in test structure 100. Also, epitaxy region 22 in test structure 200 may have substantially the same structure and the same size as epitaxy region 22 in test structure 100. Accordingly, the parasitic capacitance Cf (which is between epitaxy region 22 and gate electrode 10) in test structure 200 is substantially the same as in test structure 100. STI fins 28A and 28B do not contribute capacitance to the total capacitance Cb, which is measured between contact plug(s) 26 and gate electrode 10. Accordingly, the total capacitance Cb measured between gate electrode 10 and contact plug 26 in FIG. 2C is:

$$Cb = Cco + Cf + 1*Csw \quad [Eq. 2]$$

Wherein the value "1" is resulted from semiconductor fin 14B (FIG. 2A).

From Equations 1 and 2, the following equation is obtained:

$$(Ca - Cb) = 2*Csw \quad [Eq. 3]$$

In accordance with some embodiments, to find out the relationship between Csw and Hfin, three sets of sample test structures, each having the structures as shown in FIGS. 1A through 2C, may be manufactured on silicon wafers. Alternatively, two or more than three sets of sample test structures may be formed. The plurality of sets of sample test structures have substantially the same structure, except in the first, the second, and the third sets of sample test structures, the respective fin heights Hfin are equal to Hfin1, Hfin2, and Hfin3, respectively. The respective total capacitance values are measured from the respective contact plug(s) 26 and gate electrodes 10 in the sample test structures. The total capacitance values may be plotted as a function of the fin heights to obtain FIG. 3.

Figure 3:
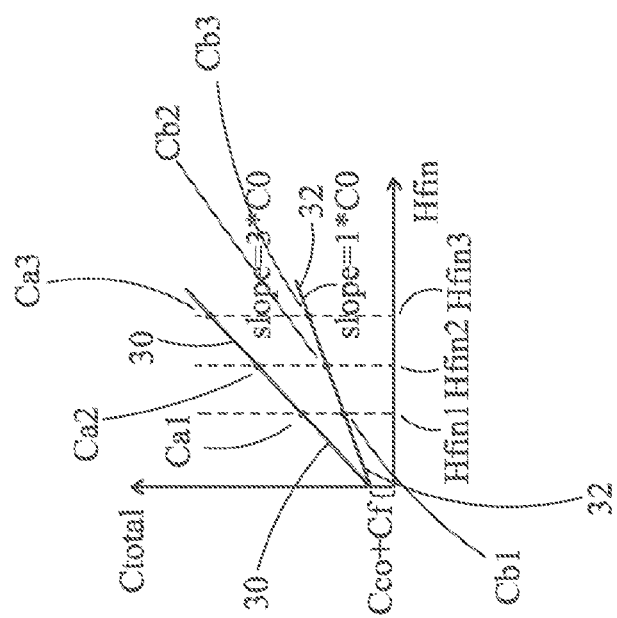
FIG. 3 illustrates the capacitance values measured from sample fins as a function of the respective fin heights.

In FIG. 3, total capacitance values Ca1, Ca2, and Ca3 are obtained from sample test structures 100 that have fin heights Hfin1, Hfin2, and Hfin3, respectively. Total capacitance values Cb1, Cb2, and Cb3 are obtained from sample test structures 200 that have fin heights Hfin1, Hfin2, and Hfin3, respectively. Line 30 is the fit line fitting the capacitance values Ca1, Ca2, and Ca3. Line 32 is the fit line fitting the capacitance values Cb1, Cb2, and Cb3. Lines 30 and 32, when extended, will cross each other where fin height Hfin equals zero, at which the total capacitance Ctotal is equal to Cco+Cf. It is appreciated that the cross point is an imaginary point since a real fin having a height equal to zero does not exist. If the slope of line 32 is referred to as capacitance-change sensitivity Co, then the slope of line 30 is 3Co. Slope Co is equal to ΔCtotal/ΔHfin, and represents the capacitance-change sensitivity of a single fin 14 in FIGS. 1A through 2C in response to the change in fin height Hfin. Accordingly, by forming sample test structure sets, capacitance-change sensitivity Co may be obtained from FIG. 3.

Using FIG. 3, Equation 3 may be rewritten as:

$$Hfin = (Ca - Cb)/(2*Co) \quad [Eq. 4]$$

Wherein capacitance values Ca and Cb are the total capacitance values measured from test structures 100 and 200, whose fin height is equal to Hfin, which is to be determined.

With capacitance-change sensitivity Co known, if the fin height on a wafer/die needs to be determined, test structures 100 and 200 may be formed on the wafer/die. After the manufacturing of the wafer/die, the total capacitances Ca and Cb may be measured from test structures 100 and 200 (that are formed on the wafer/die), respectively. Equation 4 may then be used to calculate the fin height of the fins on the wafer/die.

FIGS. 4A through 5B illustrate test structures for determining the overlap capacitance of fins on a wafer/die. The overlap capacitance may be the capacitance between gate electrode 10 and the respective underlying components, such as Lightly-Doped Drain/source (LDD) regions, in the underlying fin. Unless specified otherwise, the materials and the formation methods of the components in these embodiments are essentially the same as the like components, which are denoted by like reference numerals in the embodiments shown in FIGS. 1A through 2C. The details of the like components are thus not repeated herein, and may be found in the discussion of the embodiments shown in FIGS. 1A through 2C.

Figure 4A:
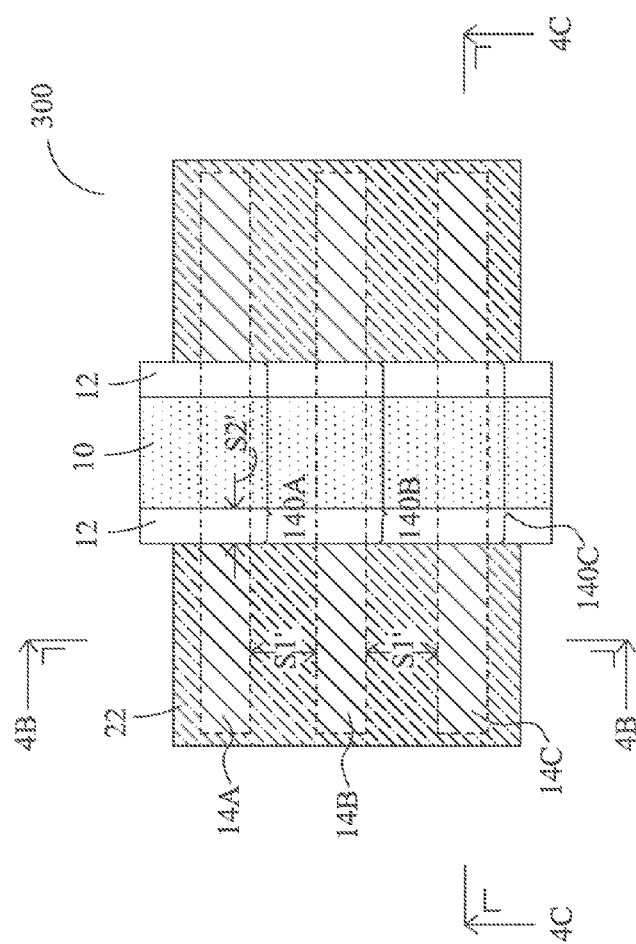
FIGS. 4A through 5B are top views and cross-sectional views of test structures for determining overlap capacitances of fins in accordance with some exemplary embodiments.
Figure 4B:
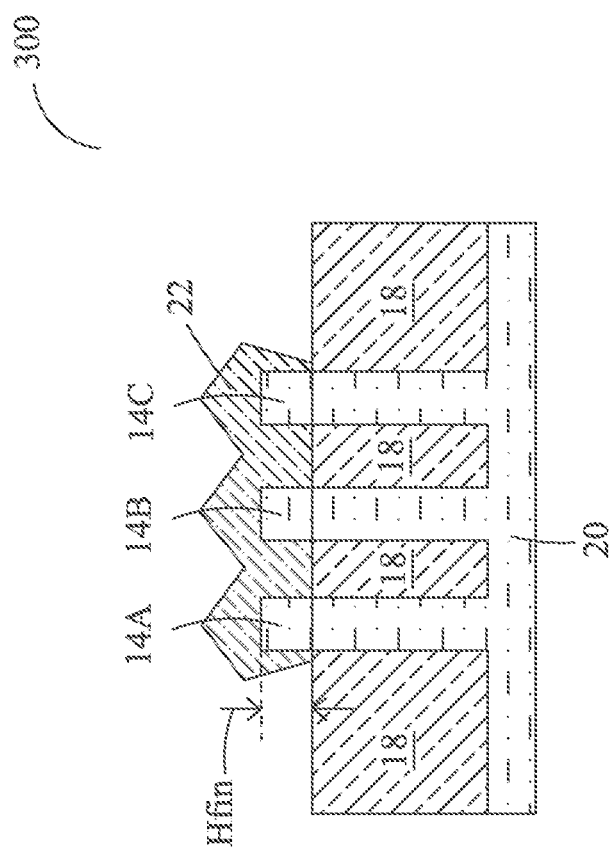
Figure 4C:
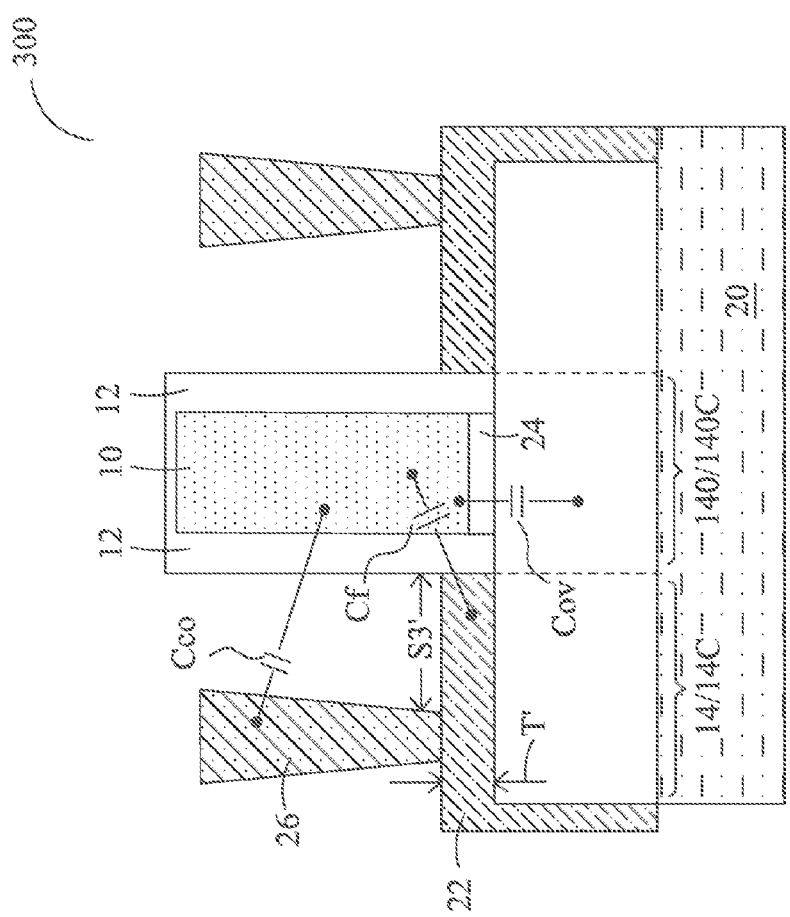

Referring to FIG. 4A, test structure 300 is formed, and includes gate electrode 10, gate spacers 12, semiconductor fins 14 (including 14A, 14B, and 14C), epitaxy region 22, and contact plug(s) 26 (FIG. 4C). Test structure 300 differs from test structure 100 in that semiconductor fin portions 140A, 140B, and 140C extend underlying gate electrode 10 and gate spacers 12. Semiconductor fin portions 140A, 140B, and 140C are connected to semiconductor fins 14A, 14B, and 14C, respectively. Accordingly, overlap capacitance Coy (FIG. 4C) is formed between gate electrode 10 and each of semiconductor fins 14A/140A, 14B/140B, and 14C/140C. FIGS. 4B and 4C illustrate the cross-sectional views obtained from the planes crossing lines 4B-4B and 4C-4C in FIG. 4A. The total capacitance Cc measured between contact plug 26 (FIG. 4C) and gate electrode 10 is:

$$Cc = Cco + Cf + 3*Cov \quad [Eq. 5]$$

Wherein the value "3" is resulted from three semiconductor fins 14A, 14B, and 14C, whose overlap capacitances are added together.

Figure 5A:
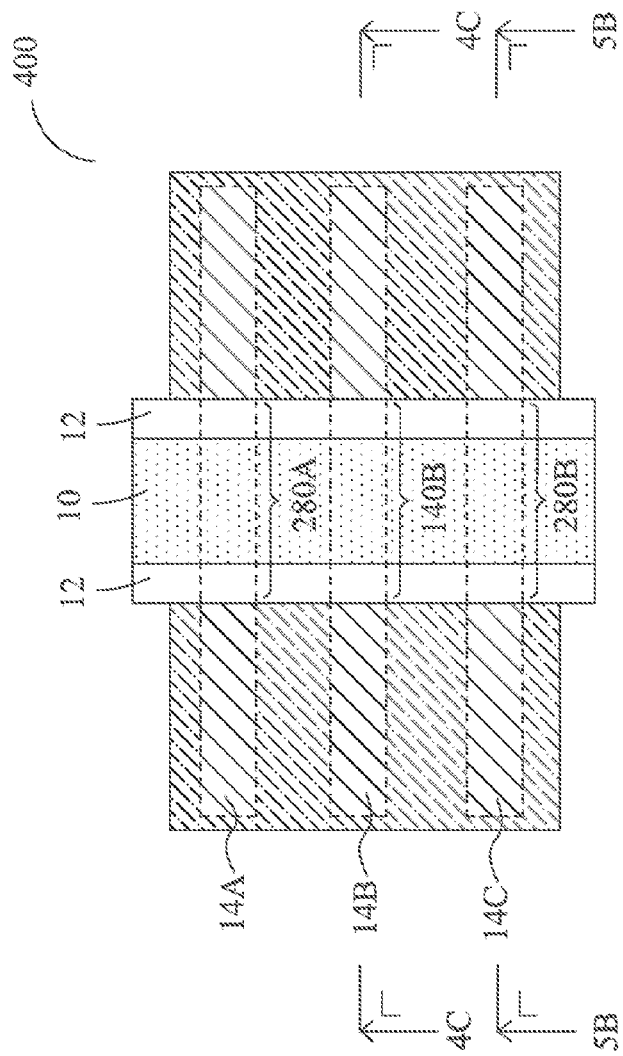
Figure 5B:
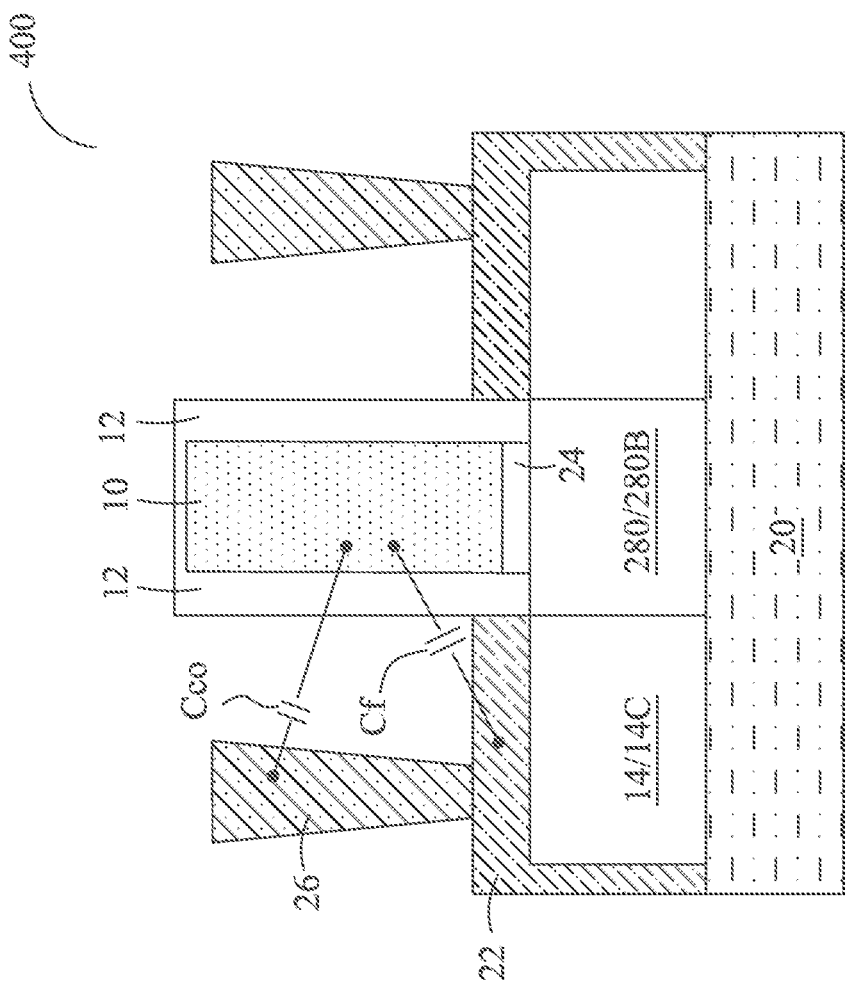

Referring to FIGS. 5A and 5B, test structure 400 is formed. Test structure 300 is identical to test structure 400, except that some of fin portions 140A, 140B, and 140C in test structure 300 are replaced with dielectric fins to form test structure 400. For example, in FIG. 5A, fin portions 140A and 140C as in test structure 300 are replaced with STI fins 280A and 280B, respectively, and fin portion 140B remain not replaced. Except for the replacement of STI fins 280A and 280B, other components, including their sizes, materials, relative positions, etc. in test structure 400 are the same as the respective like components in test structure 300. FIG. 5B illustrates a cross-sectional view of the structure shown in FIG. 5A, wherein the cross-sectional view is obtained from the plane crossing line 5B-5B in FIG. 5A. The cross-sectional view obtained from the plane crossing line 4C-4C in FIG. 5A may also be represented by FIG. 4C. In FIGS. 5A and 5B, STI fins 280A and 280B do not contribute to the total capacitance Cd measured between contact plug(s) 26 and gate electrode 10. Accordingly, the total capacitance Cd measured between contact plug 26 and gate electrode 10 is:

$$Cd = Cco + Cf + 1 * Cov \qquad \text{[Eq. 6]}$$

From Equations 5 and 6, overlap capacitance Coy may be calculated as:

$$Coy = (Cc - Cd)/2 \qquad \text{[Eq. 7]}$$

Accordingly, by forming the test set including test structures 300 and 400 on the same chip/die, the overlap capacitance Coy between a gate electrode and each of the underlying semiconductor fin may be measured and calculated.

In accordance with embodiments, in a method, a first and a second test structures are provided. The first test structure includes a first isolation region, a first gate electrode over the first isolation region, a first and a second semiconductor fin parallel to each other, and a first contact plug over and electrically connected to the first and the second semiconductor fins. The second test structure includes a second isolation region, a second gate electrode over the second isolation region, a third semiconductor fin and a dielectric fin, and a second contact plug over and connected to the third semiconductor fin. The first, the second, and the third semiconductor fins and the dielectric fin have substantially a same fin height. The method further includes measuring a first capacitance between the first gate electrode and the first contact plug, measuring a second capacitance between the second gate electrode and the second contact plug, and calculating the same fin height from a capacitance difference between the second capacitance and the first capacitance.

In accordance with other embodiments, a method includes providing a first and a second test structure. The first test structure includes a first gate electrode, a first and a second semiconductor fin parallel to each other and extending from a side of the gate electrode to underlying the first gate electrode, and a first contact plug over and electrically connected to the first and the second semiconductor fins. The second test structure includes a second gate electrode, a third semiconductor fin extending from a side of the gate electrode to underlying the second gate electrode, a fourth semiconductor fin parallel to the third semiconductor fin and on a side of the second gate electrode, and a dielectric fin having a lengthwise direction aligned to a lengthwise direction of the fourth semiconductor fin, and a second contact plug over and electrically connected to the first and the second semiconductor fins. The dielectric fin is underlying the second gate electrode. The first, the second, the third, the fourth semiconductor fins and the dielectric fin have substantially a same fin height. The method further includes measuring a first capacitance between the first gate electrode and the first contact plug, measuring a second capacitance between the second gate electrode and the second contact plug, and calculating an overlap capacitance from a capacitance difference between the second capacitance and the first capacitance.

In accordance with yet other embodiments, a device includes a first and a second test structure. The first test structure includes a first isolation region over a substrate, a first gate electrode over the first isolation region, a first and a second semiconductor fin parallel to each other and on a side of the first gate electrode, wherein the first and the second semiconductor fins have a first spacing, and a first contact plug over and electrically connected to the first and the second semiconductor fins. The second test structure includes a second isolation region over the substrate, a second gate electrode over the second isolation region, a third semiconductor fin and a dielectric fin parallel to each other and on a side of the second gate electrode, and a second contact plug over and electrically connected to the third semiconductor fin. The first, the second, and the third semiconductor fins and the first dielectric have substantially a same fin height and a same fin width. The third semiconductor fin and the first dielectric fin have a second spacing equal to the first spacing.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    providing a first test structure comprising:
        a first isolation region;
        a first gate electrode over the first isolation region;
        a first and a second semiconductor fin parallel to each other and on a side of the first gate electrode; and
        a first contact plug over and electrically connected to the first and the second semiconductor fins;
    providing a second test structure comprising:
        a second isolation region;
        a second gate electrode over the second isolation region;
        a third semiconductor fin and a first dielectric fin parallel to each other and on a side of the second gate electrode, wherein the first, the second, and the third semiconductor fins and the first dielectric fin have substantially a same fin height; and
        a second contact plug over and electrically connected to the third semiconductor fin;

measuring a first capacitance between the first gate electrode and the first contact plug;
measuring a second capacitance between the second gate electrode and the second contact plug; and
calculating the same fin height from a capacitance difference between the second capacitance and the first capacitance.

2. The method of claim 1 further comprising:
forming a plurality of sets of test structures, each comprising two test structures including essentially same components as the first and the second test structures, wherein fin heights of semiconductor fins and dielectric fins in each of the plurality of sets of test structures are different from fin heights in other ones of the plurality of sets of test structures;
measuring capacitances from the plurality of sets of test structures;
calculating a capacitance-change sensitivity from the capacitances, wherein the capacitance-change sensitivity reflects a change of capacitances measured between gate electrodes in the plurality of sets of test structures and corresponding contact plugs; and
performing the step of calculating the same fin height by dividing the capacitance difference by the capacitance-change sensitivity.

3. The method of claim 1, wherein the first and the second test structures are formed on a same substrate.

4. The method of claim 1, wherein the first test structure further comprises a fourth semiconductor fin parallel to the first and the second semiconductor fins and on the side of the first gate electrode, and the second test structure further comprises a second dielectric fin parallel to the first dielectric fin and on the side of the second gate electrode, and wherein fin heights of the fourth semiconductor fin and the second dielectric fin are substantially equal to the same fin height.

5. The method of claim 1 further comprising:
forming a first epitaxy semiconductor region on the first and the second semiconductor fins and underlying the first contact plug; and
forming a second epitaxy semiconductor region on the third semiconductor fin and the first dielectric fin and underlying the second contact plug, wherein the first and the second epitaxy semiconductor regions have substantially a same thickness.

6. The method of claim 1, wherein the first and the second semiconductor fins have a first spacing between each other, and the third semiconductor fin and the first dielectric fin have a second spacing between each other, and wherein the first spacing is equal to the second spacing.

7. The method of claim 6, wherein the first and the second semiconductor fins have a first spacing from the first gate electrode, and the third semiconductor fin and the first dielectric fin have a second spacing from the second gate electrode, and wherein the first spacing is equal to the second spacing.

8. A method comprising:
providing a first test structure comprising:
a first gate electrode;
a first and a second semiconductor fin parallel to each other and extending from a side of the gate electrode to underlying the first gate electrode; and
a first contact plug over and electrically connected to the first and the second semiconductor fins;
providing a second test structure comprising:
a second gate electrode;
a third semiconductor fin extending from a side of the gate electrode to underlying the second gate electrode;
a fourth semiconductor fin parallel to the third semiconductor fin and on a side of the second gate electrode;
a first dielectric fin having a lengthwise direction aligned to a lengthwise direction of the fourth semiconductor fin, wherein the first dielectric fin is underlying the second gate electrode, and wherein the first, the second, the third, the fourth semiconductor fins and the first dielectric fin have substantially a same fin height; and
a second contact plug over and electrically connected to the first and the second semiconductor fins;
measuring a first capacitance between the first gate electrode and the first contact plug;
measuring a second capacitance between the second gate electrode and the second contact plug; and
calculating an overlap capacitance from a capacitance difference between the second capacitance and the first capacitance.

9. The method of claim 8, wherein the first and the second test structures are formed on a same substrate.

10. The method of claim 8, wherein the first test structure further comprises a fifth semiconductor fin parallel to the first and the second semiconductor fins and extend from the side of the first gate electrode to underlying the first gate electrode, and the second test structure further comprises:
a sixth semiconductor fin parallel to the third and the fourth semiconductor fins and on the side of the second gate electrode; and
a second dielectric fin having a lengthwise direction aligned to a lengthwise direction of the sixth semiconductor fin, wherein the second dielectric fin is underlying the second gate electrode, and wherein the sixth semiconductor fin and the second dielectric fin have the same fin height as the first semiconductor fin.

11. The method of claim 8 further comprising:
forming a first epitaxy semiconductor region on the first and the second semiconductor fins and underlying the first contact plug; and
forming a second epitaxy semiconductor region on the third and the fourth semiconductor fins and underlying the second contact plug, wherein the first and the second epitaxy semiconductor regions have substantially a same thickness.

12. The method of claim 8, wherein the first and the second semiconductor fins have a first spacing between each other, and the third and the fourth semiconductor fins have a second spacing between each other, and wherein the first spacing is equal to the second spacing.

13. The method of claim 8, wherein the first, the second, the third, and the fourth semiconductor fins and the first dielectric fin have a same width.

14. A device comprising:
a first test structure comprising:
a first isolation region over a substrate;
a first gate electrode over the first isolation region;
a first and a second semiconductor fin parallel to each other and on a side of the first gate electrode, wherein the first and the second semiconductor fins have a first spacing; and
a first contact plug over and electrically connected to the first and the second semiconductor fins; and
a second test structure comprising:
a second isolation region over the substrate;
a second gate electrode over the second isolation region;
a third semiconductor fin and a first dielectric fin parallel to each other and on a side of the second gate electrode, wherein the first, the second, and the third semiconductor fins and the first dielectric have substantially a same fin height and a same fin width, and wherein the third semiconductor fin and the first dielectric fin have a second spacing equal to the first spacing; and
a second contact plug over and electrically connected to the third semiconductor fin.

15. The device of claim 14, wherein the first test structure further comprises a fourth semiconductor fin parallel to the first and the second semiconductor fins and on the side of the first gate electrode, and the second test structure further comprises a second dielectric fin parallel to the first dielectric fin and on the side of the second gate electrode, and wherein fin heights and fin widths of the fourth semiconductor fin and the second dielectric fin are substantially equal to the same fin height and the same fin width, respectively.

16. The device of claim 15, wherein the fourth semiconductor fin and the first semiconductor fin are on opposite sides of the second semiconductor fin, wherein the first and the second dielectric fins are on opposite sides of the third semiconductor fin, and wherein a spacing between the fourth semiconductor fin and the second semiconductor fin is equal to a spacing between the third semiconductor fin and the second dielectric fin.

17. The device of claim 14 further comprising:
a first epitaxy semiconductor region on the first and the second semiconductor fins and underlying the first contact plug; and
a second epitaxy semiconductor region on the third semiconductor fin and the first dielectric fin and underlying the second contact plug, wherein the first and the second epitaxy semiconductor regions have substantially a same thickness.

18. The device of claim 14, wherein the first and the second semiconductor fins have a first spacing between each other, and the third semiconductor fin and the first dielectric fin have a second spacing between each other, and wherein the first spacing is equal to the second spacing.

19. The device of claim 14, wherein the first and the second semiconductor fins have a first spacing from the first gate electrode, and the third semiconductor fin and the first dielectric fin have a second spacing from the second gate electrode, and wherein the first spacing is equal to the second spacing.

20. The device of claim 14, wherein the first contact plug has a first spacing from the first gate electrode, wherein the second contact plug has a second spacing from the second gate electrode, and wherein the first spacing is equal to the second spacing.

* * * * *